(12) United States Patent
Kang et al.

(10) Patent No.: US 10,134,664 B2
(45) Date of Patent: Nov. 20, 2018

(54) INTEGRATED CIRCUIT PACKAGING SYSTEM WITH EMBEDDED PAD ON LAYERED SUBSTRATE AND METHOD OF MANUFACTURE THEREOF

(71) Applicant: STATS ChipPAC Pte. Ltd., Singapore (SG)

(72) Inventors: MinKyung Kang, Seoul (KR); YoungDal Roh, Icheon-si (KR); Dong Ju Jeon, Seoul (KR); KyoungHee Park, Seoul (KR)

(73) Assignee: STATS ChipPAC Pte. Ltd., Singapore (SG)

(*) Notice: Subject to any disclaimer, the term of this patent is extended or adjusted under 35 U.S.C. 154(b) by 0 days.

(21) Appl. No.: 15/433,866

(22) Filed: Feb. 15, 2017

(65) Prior Publication Data
US 2017/0162495 A1   Jun. 8, 2017

Related U.S. Application Data

(63) Continuation of application No. 13/928,754, filed on Jun. 27, 2013, now Pat. No. 9,607,938.

(51) Int. Cl.
*H01L 23/49* (2006.01)
*H01L 21/50* (2006.01)
(Continued)

(52) U.S. Cl.
CPC ...... *H01L 23/49838* (2013.01); *H01L 21/486* (2013.01); *H01L 21/4853* (2013.01);
(Continued)

(58) Field of Classification Search
CPC ............... H01L 23/49811; H01L 21/50; H01L 2224/16225; H01L 2924/01079;
(Continued)

(56) References Cited

U.S. PATENT DOCUMENTS 9,607,938 B2 *   3/2017   Kang ................. H01L 23/49822
2003/0218249 A1 * 11/2003   Ho ......................... H01L 21/563
257/737

(Continued)

FOREIGN PATENT DOCUMENTS

CN          102903680         1/2013

OTHER PUBLICATIONS

U.S. Appl. No. 13/928,754, Non-Final Office Action dated Nov. 20, 2014.
(Continued)

*Primary Examiner* — Allen Parker
*Assistant Examiner* — Didarul Mazumder
(74) *Attorney, Agent, or Firm* — Wong & Rees LLP

(57) ABSTRACT

An integrated circuit packaging system and method of manufacture thereof includes: a dielectric core having an embedded pad; a top solder resist layer on the dielectric core, a pad top surface of the embedded pad below the top solder resist layer; a device interconnect attached to the embedded pad; and an integrated circuit device having an interconnect pillar, the interconnect pillar attached to the device interconnect for mounting the integrated circuit device to the dielectric core.

20 Claims, 7 Drawing Sheets

(51) Int. Cl.
*H01L 23/498* (2006.01)
*H01L 21/48* (2006.01)
*H01L 23/00* (2006.01)

(52) U.S. Cl.
CPC .... *H01L 21/4857* (2013.01); *H01L 23/49811* (2013.01); *H01L 23/49822* (2013.01); *H01L 23/49827* (2013.01); *H01L 23/49894* (2013.01); *H01L 24/16* (2013.01); *H01L 2224/16225* (2013.01); *H01L 2224/16227* (2013.01); *H01L 2924/3841* (2013.01)

(58) Field of Classification Search
CPC . H01L 2224/13099; H01L 2924/01029; H01L 2924/01078; H01L 2924/01013; H01L 24/11; H01L 2924/14
USPC .......................................... 257/737; 438/613
See application file for complete search history.

(56) References Cited

U.S. PATENT DOCUMENTS

| | | | |
|---|---|---|---|
| 2003/0218250 A1* | 11/2003 | Kung | H01L 21/4853 257/737 |
| 2011/0101519 A1* | 5/2011 | Hsiao | H01L 23/49827 257/737 |
| 2012/0104598 A1 | 5/2012 | Hsu et al. | |
| 2012/0146209 A1 | 6/2012 | Hu et al. | |
| 2012/0146230 A1* | 6/2012 | Lee | H01L 21/563 257/773 |
| 2012/0153463 A1 | 6/2012 | Maeda | |
| 2012/0273959 A1* | 11/2012 | Park | H01L 24/97 257/774 |
| 2012/0306104 A1 | 12/2012 | Choi et al. | |
| 2013/0062755 A1* | 3/2013 | Kuo | H01L 24/13 257/737 |
| 2015/0001705 A1 | 1/2015 | Kang et al. | |

OTHER PUBLICATIONS

U.S. Appl. No. 13/928,754, Non-Final Office Action dated Mar. 18, 2015.
U.S. Appl. No. 13/928,754, Final Office Action dated Sep. 18, 2015.
U.S. Appl. No. 13/928,754, Non-Final Office Action dated Dec. 3, 2015.
U.S. Appl. No. 13/928,754, Final Office Action dated Apr. 7, 2016.
U.S. Appl. No. 13/928,754, Advisory Action dated Jun. 20, 2016.
U.S. Appl. No. 13/928,754, Notice of Allowance dated Nov. 14, 2016.
Taiwan Patent Office, Application No. 103117099, Foreign Office Action dated Aug. 9, 2017.
Taiwan Patent Office, Application No. 103117099, Pending Claims as of Aug. 9, 2017.
Chinese Patent Office, Application No. 201410301863.2, Foreign Office Action dated Dec. 4, 2017.
Chinese Patent Office, Application No. 201410301863.2, Pending Claims as of Dec. 4, 2017.
Taiwan Patent Office, Application No. 103117099, Notice of Allowance dated Feb. 6, 2018.
Taiwan Patent Office, Application No. 103117099, Pending Claims as of Feb. 6, 2018.

* cited by examiner

INTEGRATED CIRCUIT PACKAGING SYSTEM WITH EMBEDDED PAD ON LAYERED SUBSTRATE AND METHOD OF MANUFACTURE THEREOF

CROSS-REFERENCE TO RELATED APPLICATION(S)

This application claims benefit under 35 U.S.C. § 120 as Continuation of application Ser. No. 13/928,754, filed Jun. 27, 2013, the entire contents of which is hereby incorporated by reference for all purposes as if fully set forth herein. Applicant hereby rescinds any disclaimer of claim scope in the parent application(s) or the prosecution history thereof and advise the USPTO that the claims in this application may be broader than any claim in the parent application(s).

TECHNICAL FIELD

The present invention relates generally to an integrated circuit packaging system, and more particularly to a system having an embedded pad on layered substrate.

BACKGROUND ART

Increased miniaturization of components, greater packaging density of integrated circuits ("ICs"), higher performance, and lower cost are ongoing goals of the computer industry. Semiconductor packaging structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, IC packages that are incorporated into these devices are required to be made smaller and thinner, which create problems with arranging devices on boards and other circuits. The packaging configurations that house and protect IC require them to be made smaller, thinner, and sturdier as well.

Thus, smaller and thinner integrated circuit packaging systems continue to be developed to provide low cost manufacturing, improved yields, reduction of integrated circuit packaging dimensions, and flexible stacking and integration configurations. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The embodiments of the present invention provides a method of manufacture of an integrated circuit packaging system including: forming a dielectric core having an embedded pad; forming a top solder resist layer on the dielectric core, a pad top surface of the embedded pad below the top solder resist layer; forming a device interconnect on the embedded pad; and mounting an integrated circuit device having an interconnect pillar, the interconnect pillar attached to the device interconnect for mounting the integrated circuit device to the dielectric core.

The embodiments of the present invention provides an integrated circuit packaging system including: a dielectric core having an embedded pad; a top solder resist layer on the dielectric core, a pad top surface of the embedded pad below the top solder resist layer; a device interconnect attached to the embedded pad; and an integrated circuit device having an interconnect pillar, the interconnect pillar attached to the device interconnect for mounting the integrated circuit device to the dielectric core.

Certain embodiments of the invention have other aspects in addition to or in place of those mentioned or obvious from the above. The aspects will become apparent to those skilled in the art from a reading of the following detailed description when taken with reference to the accompanying drawings.

DETAILED DESCRIPTION

Figure 1:
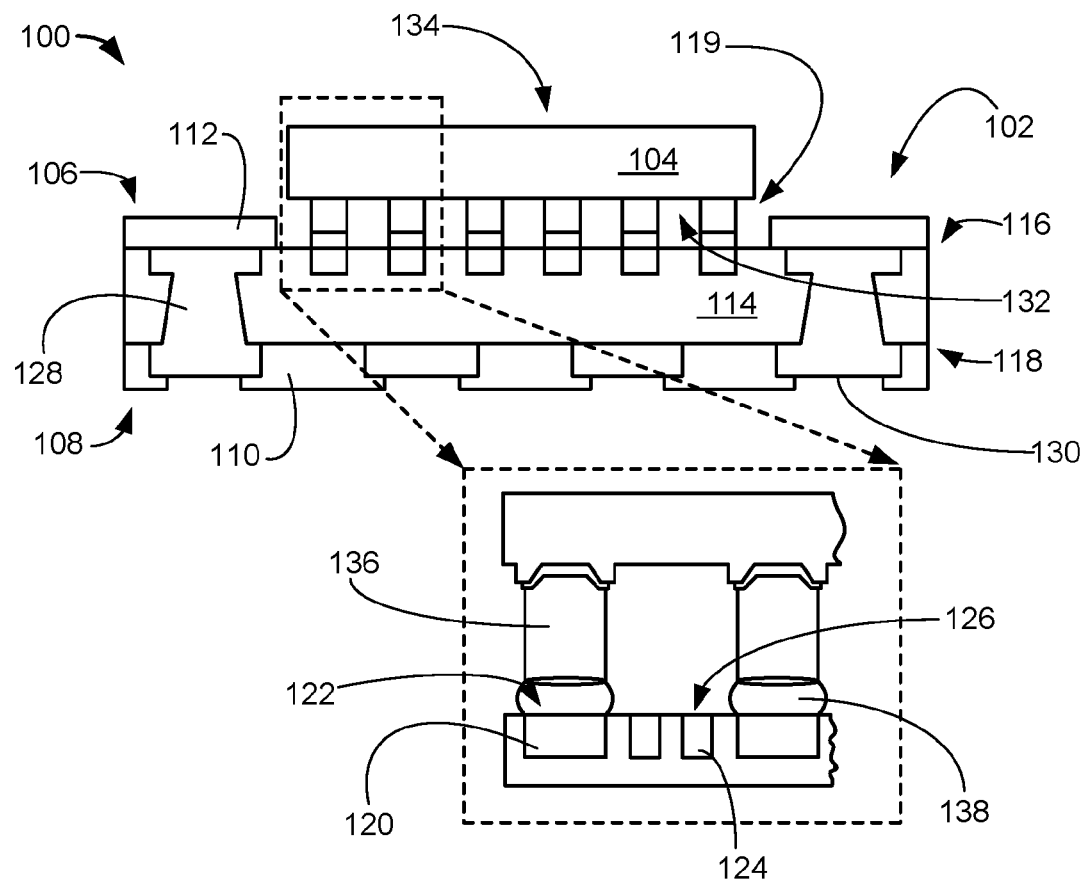
FIG. 1 is a cross-sectional view of an integrated circuit packaging system along a line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the embodiments of the present invention.

In the following description, numerous specific details are given to provide a thorough understanding of the invention. However, it will be apparent that the invention may be practiced without these specific details. In order to avoid obscuring the embodiments of the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. The depictions in the FIGs. are arbitrary for the most part. Generally, the invention can be operated in any orientation. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct physical contact between elements. The term "directly on" means there is direct physical contact between elements with no intervening elements. The term "processing" as used herein includes deposition of material, patterning, exposure, development, etching, cleaning, molding, and/or removal of the material or as required in forming a described structure.

Figure 2:
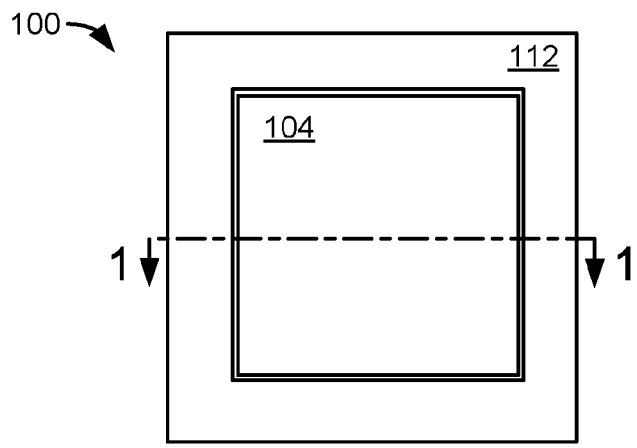
FIG. 2 is a top view of the integrated circuit packaging system.

Referring now to FIG. 1, therein is shown a cross-sectional view of an integrated circuit packaging system 100 along a line 1-1 of FIG. 2 in a first embodiment of the present invention. The integrated circuit packaging system 100 includes a base substrate 102 and an integrated circuit device 104.

The base substrate 102 can provide support and connectivity for components and devices. For example, the base substrate 102 can include a printed circuit board (PCB), a carrier substrate, a semiconductor substrate with electrical interconnections, a ceramic substrate, or a multi-layer structure (e.g., a laminate with one or more conductive layers separated by an insulator) suitable for electrically interconnecting integrated circuit systems formed on or above the base substrate 102 as examples. For illustrative purposes, the base substrate 102 is shown as a multi-layer structure.

The base substrate 102 includes conductive layers and conductive traces embedded therein. The base substrate 102 can include a component side 106 for mounting components, devices, and packages. The base substrate 102 can also include a system side 108, which is a side opposite to the component side 106, for connecting to a next system level (not shown).

The base substrate 102 can include a bottom solder resist layer 110 and a top solder resist layer 112 for providing protection to the conductive materials of the base substrate 102. The bottom solder resist layer 110 is at the system side 108 of the base substrate 102 and the top solder resist layer 112 is at the component side 106 of the base substrate 102.

The base substrate 102 can include a dielectric core 114. The dielectric core 114 can include dielectric materials, resins, or epoxy as examples. For example, the dielectric core 114 can include insulating layers of polytetrafluroethylene pre-impregnated (PPG), polymers, reinforcement fibers, glass fabrics, fillers, or other fabrics. The dielectric core 114 can include a core top side 116 and a core bottom side 118 opposite to the core top side 116.

The base substrate 102 can include a mounting region 119, which is an area of the base substrate 102 exposed from the top solder resist layer 112 for mounting devices. The mounting region 119 is shown as a continuous opening in the top solder resist layer 112 for exposing contact pads on the core top side 116. The mounting region 119 can be sized according to the device or chip mounted thereon.

The base substrate 102 can include an embedded pad 120. The embedded pad 120 is a contact pad formed within the dielectric core 114. A pad top surface 122 of the embedded pad 120 is formed to be coplanar with the core top side 116 of the dielectric core 114. A number of the embedded pad 120 can be arranged in the mounting region 119 for providing a conductive connection for semiconductor devices mounted on the base substrate 102.

The base substrate 102 also includes a surface trace 124 on the core top side 116 of the dielectric core 114. The surface trace 124 provides conductive connections to other areas of the base substrate 102. The surface trace 124 is embedded in the dielectric core 114 with a top trace surface 126 coplanar with the core top side 116 of the dielectric core 114 and the pad top surface 122. The surface trace 124 can be between the embedded pad 120 and another of the embedded pad 120.

The dimensions between the embedded pad 120 and the surface trace 124 can include a pitch of 25 micrometers (μm). The dimensions between the surface trace 124 and another of the surface trace 124 can include a pitch of 15 μm. The width of the embedded pad 120 can be 35 μm and the width of the surface trace 124 can be 15 μm. The configuration of the embedded pad 120 and the surface trace 124 formed in the dielectric core 114 allows for reliable very fine pitch top surface dimensions as stated in the dimension above.

The base substrate 102 can include a via 128 and a system pad 130. The via 128 provides a conductive connection from the core top side 116 to the core bottom side 118 of the dielectric core 114. The system pad 130 is a contact pad on the core bottom side 118 for mounting interconnects on the system side 108 of the base substrate 102.

The integrated circuit device 104 is defined as a semiconductor device having one or more integrated transistors for implementing active circuitry. For example, the integrated circuit device 104 can include interconnects, passive devices, or a combination thereof. For example, a flip-chip or a wafer scale chip can be representative of the integrated circuit device 104. The integrated circuit device 104 is preferably shown in a flip-chip configuration. However, the integrated circuit device 104 can also be in a wire-bonded configuration.

The integrated circuit device 104 can include an interconnect side 132 for attaching a device interconnect 138. The interconnect side 132 can include contacts, fabricated thereon, and be directly attached to the device interconnect 138. The integrated circuit device 104 can also include a device top side 134, which is a side opposite the interconnect side 132.

The integrated circuit device 104 can be attached or mounted to the component side 106 of the base substrate 102 by an interconnect pillar 136 and the device interconnect 138. The interconnect pillar 136 is attached to the interconnect side 132 of the integrated circuit device 104. The interconnect pillar 136 can provide a fine pitch between connection points on the interconnect side 132 of the integrated circuit device 104.

For example, the dimensions between of the interconnect pillar 136 and another of the interconnect pillar 136 can include a pitch of 150 µm for a fine pitch while allowing space for the surface trace 124 to be between pillars. The height of the interconnect pillar 136 can be 30 µm and the width of the interconnect pillar 126 can be 45 µm.

The device interconnect 138 provides an electrical connection and can include a solder ball, a bond wire, or solder as examples. The device interconnect 138 provides electrical connectivity between the integrated circuit device 104 and the base substrate 102. The device interconnect 138 are sized according to the interconnect pillar 136 providing for finer interconnects in a small space.

For example, the height of the device interconnect 138 can be 25 µm and the width of the device interconnect 138 can be 45 µm to match the width of the interconnect pillar 136. The top solder resist layer 112 prevents bump bridging of the device interconnect 138 onto the surface trace 124.

It has been discovered that the integrated circuit packaging system 100 with the embedded pad 120 prevents bump bridging between the embedded pad 120 and the surface trace 124 resulting in a more reliable connection. The wetting and surface tension on the device interconnect 138 combined with the dialectic material of the dielectric core 114 allows the device interconnect 138 to remain self-confined and not flow over to adjacent structures.

It has been discovered that the dielectric material of the dielectric core 114 extending from and coplanar to the embedded pad 120 and the surface trace 124 restrains the outward flow of the device interconnect 138 during reflow and reduces the occurrences of bump bridging or electrical shorting between adjacent conductive structures.

It has been discovered that the embedded pad 120 and the surface trace 124 being formed within the dielectric core 114 provides bonding surfaces with improved manufacturing reliability, reduces pitch size between pads and traces, and provides uniform pattern width. The top surfaces of the embedded pad 120 and the surface trace 124 are preserved from pattern loss due to etching in fine patterned configurations. For example, the dielectric core 114 preserves the reliability of fine pitched conductive structures from etching such that the dimensions between the embedded pad 120 and the surface trace 124 can include a pitch of 25 micrometers (µm). The dimensions between the surface trace 124 and another of the surface trace 124 can include a pitch of 15 µm. The width of the embedded pad 120 can be 35 µm and the width of the surface trace 124 can be 15 µm.

It has been discovered that the integrated circuit packaging system 100 with the embedded pad 120 prevents bump bridging between the embedded pad 120 and another of the embedded pad 120 resulting in a more reliable connection. The wetting and surface tension on the device interconnect 138 combined with the dialectic material of the dielectric core 114 allows the device interconnect 138 to remain self-confined and not flow over to adjacent structures.

It has been discovered that the interconnect pillar 136, the device interconnect 138, and the embedded pad 120 provide for finer conductive patterning and small pitch between conductive structures reducing the required space for the integrated circuit device 104. The interconnect pillar 136 provides for separation and a smaller interconnection structure than if the device interconnect 138 was mounted directly to the integrated circuit device 104. The interconnect pillar 136 allows for a small pitch between pillars, which also results in a fine small pitch between device interconnects and embedded pads.

Referring now to FIG. 2, therein is shown a top view of the integrated circuit packaging system 100. The device top side of the integrated circuit device 104 and the top solder resist layer 112 is shown.

Figure 3:
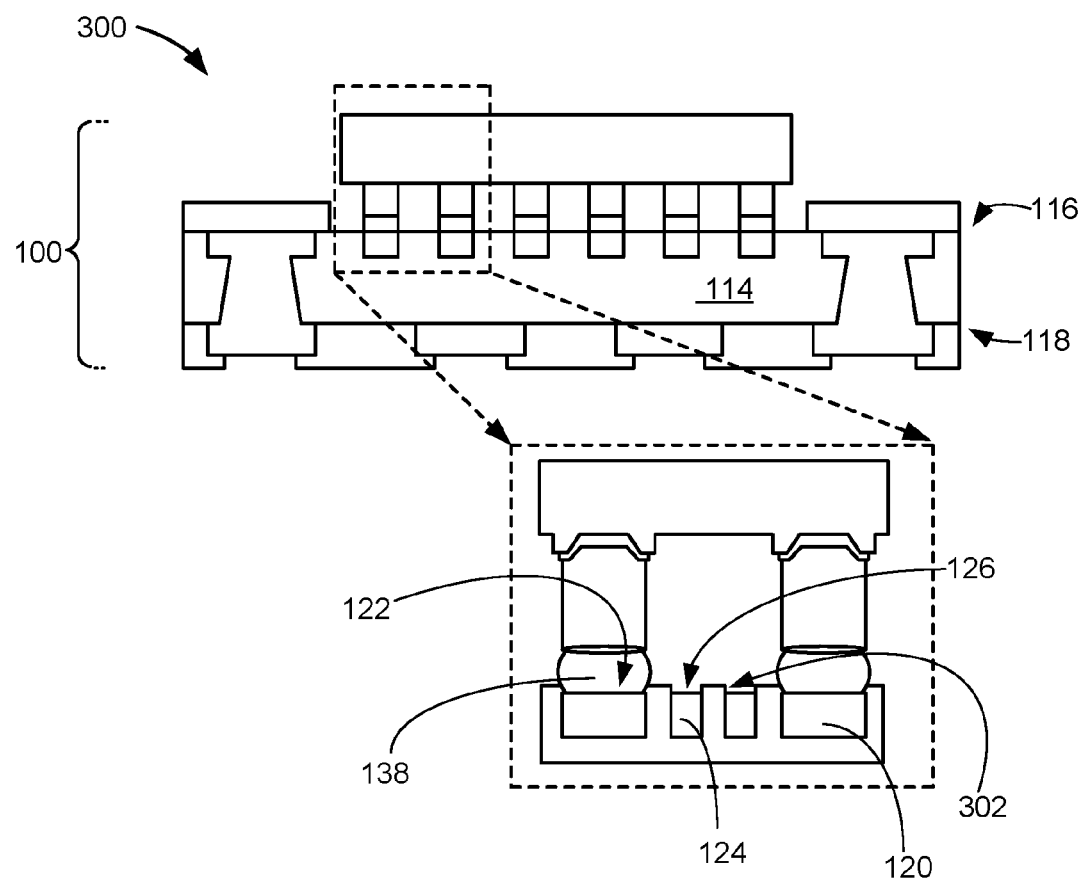
FIG. 3 is a cross-sectional view of an integrated circuit packaging system along a line 1-1 of FIG. 2 in a second embodiment of the present invention.

Referring now to FIG. 3, therein is shown a cross-sectional view of an integrated circuit packaging system 300 along a line 1-1 of FIG. 2 in a second embodiment of the present invention. The integrated circuit packaging system 300 can be similar to the integrated circuit packaging system 100 of FIG. 1 except the integrated circuit packaging system 300 can include the embedded pad 120 and the surface trace 124 below the core top side 116 of the dielectric core 114. It is understood that the integrated circuit packaging system 300 and the integrated circuit packaging system 100 can share identical element numbers.

The integrated circuit device 300 can include core sidewalls 302 extending between the core top side 116 and the pad top surface 122 of the embedded pad 120. The core sidewalls 302 can also extend between the core top side 116 and the top trace surface 126 of the surface trace 124. The core sidewalls 302 can act as a barrier or dam for confining the conductive material of the device interconnect 138 from contacting adjacent structures. For example, the core sidewalls 302 can provide a recess depth including a range of 5 µm plus or minus 3 µm. The pad top surface 122 can be below the core top side 116 with a depth including a range of 5 µm plus or minus 3 µm.

For example, the core sidewalls 302 can contain the conductive material of the device interconnect 138 during reflow for preventing bump bridging between the embedded pad 120 and the surface trace 124. Bump bridging is prevented because the conductive material of the device interconnect 138 must flow over the core sidewalls 302 of the embedded pad 120, over a portion of the core top side 116, and over the core sidewalls 302 of the surface trace 124 for bump bridging to occur.

It has been discovered that the core sidewalls 302 extending from the embedded pad 120 and the surface trace 124 to the core top side 116 function as a barrier for preventing bump bridging of the device interconnect 138. During reflow, the conductive material of the device interconnect 138 is confined by the core sidewalls 302 as the additional depth of a range of 5 µm plus or minus 3 µm helps contain the reflowed material. Bump bridging is prevented by the surface tension, the depth of the core sidewalls 302, and the portions of the dielectric core 114 between the pads and traces.

It has been discovered that the integrated circuit packaging system 300 with the embedded pad 120 prevents bump bridging between the embedded pad 120 and the surface trace 124 resulting in a more reliable connection. The wetting and surface tension on the device interconnect 138 combined with the dialectic material of the dielectric core 114 allows the device interconnect 138 to remain self-confined and not flow over to adjacent structures.

It has been discovered that the embedded pad 120 and the surface trace 124 being formed within the dielectric core 114 provides bonding surfaces with improved manufacturing reliability, reduces pitch size between pads and traces, and provides uniform pattern width. The top surfaces of the embedded pad 120 and the surface trace 124 are preserved from pattern loss due to etching in fine patterned configurations. For example, the dielectric core 114 preserves the reliability of fine pitched conductive structures from etching such that the dimensions between the embedded pad 120 and the surface trace 124 can include a pitch of 25 micrometers (μm). The dimensions between the surface trace 124 and another of the surface trace 124 can include a pitch of 15 μm. The width of the embedded pad 120 can be 35 μm and the width of the trace can be 15 μm.

It has been discovered that the integrated circuit packaging system 300 with the embedded pad 120 prevents bump bridging between the embedded pad 120 and another of the embedded pad 120 resulting in a more reliable connection. The wetting and surface tension on the device interconnect 138 combined with the dialectic material of the dielectric core 114 allows the device interconnect 138 to remain self-confined and not flow over to adjacent structures.

It has been discovered that the interconnect pillar 136, the device interconnect 138, and the embedded pad 120 provide for finer conductive patterning and small pitch between conductive structures reducing the required space for the integrated circuit device 104 of FIG. 1. The interconnect pillar 136 provides for separation and a smaller interconnection structure than if the device interconnect 138 was mounted directly to the integrated circuit device 104. The interconnect pillar 136 allows for a small pitch between pillars, which also results in a fine small pitch between device interconnects and embedded pads.

Figure 4:
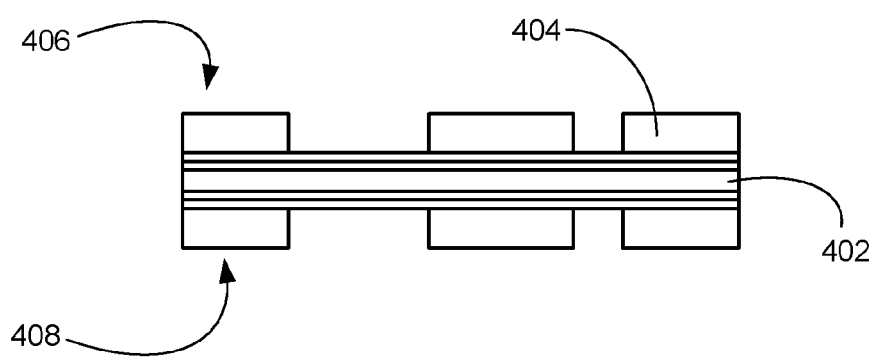
FIG. 4 is a portion of the base substrate of FIG. 1 in a core-lamination phase of manufacture.

Referring now to FIG. 4, therein is shown a portion of the base substrate 102 of FIG. 1 in a core-lamination phase of manufacture. A detach core 402 is provided. The detach core 402 can include a carrier for developing a dry film laminate 404 such as a metal carrier, SUS plate, FR4 plate, or polymer reinforced plate as examples.

The detach core 402 can include a carrier top side 406 and a carrier bottom side 408 opposite to the carrier top side 406. The dry film laminate 404 can be developed on the carrier top side 406 and the carrier bottom side 408. The dry film laminate 404 can be processed or selectively developed on the detach core 402 leaving regions of the detach core 402 exposed from the dry film laminate 404. Plating material can subsequently be deposited on the exposed regions of the detach core 402.

Figure 5:
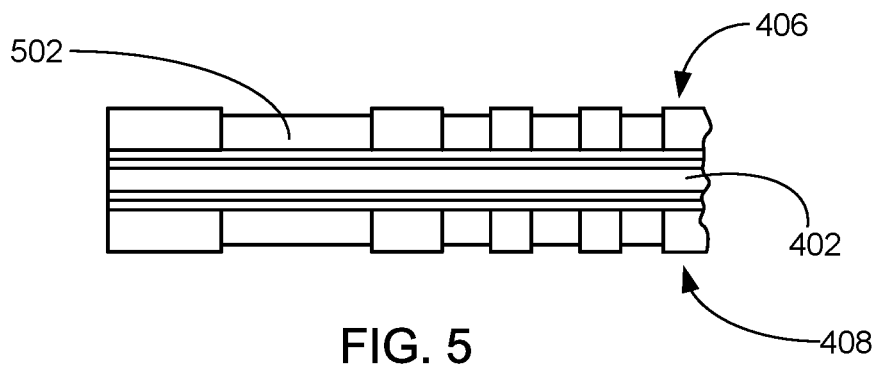
FIG. 5 is the structures of FIG. 4 in a core-plating phase of manufacture.

Referring now to FIG. 5, therein is shown the structures of FIG. 4 in a core-plating phase of manufacture. A plating 502 can be deposited on the carrier top side 406 and the carrier bottom side 408. The plating 502 can be of a conductive material such as copper. The process for depositing the plating 502 can include chemical vapor deposition (CVD), physical vapor deposition (PVD), electrolytic plating, and electroless plating processes as examples.

For illustrate purposes, copper is used to plate the exposed regions of the detach core 402. On the carrier top side 406, a top surface of the dry film laminate 404 is above a top surface of the plating 502. During the core-plating phase, the carrier bottom side 408 can be formed to mirror the carrier top side 406.

Figure 6:
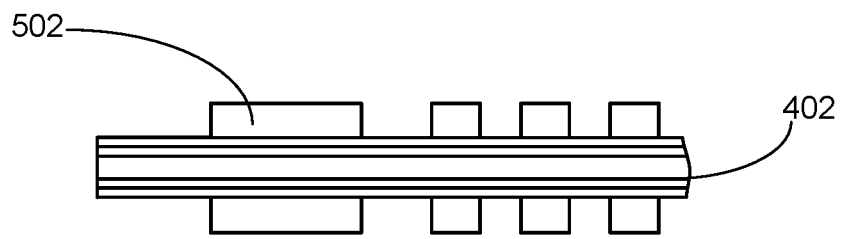
FIG. 6 is the structure of FIG. 5 in a laminate-stripping phase of manufacture.

Referring now to FIG. 6, therein is shown the structure of FIG. 5 in a laminate-stripping phase of manufacture. The dry film laminate 404 of FIG. 4 on the detach core 402 can be stripped away leaving the plating 502 and portions of the detach core 402 exposed from the plating 502.

Figure 7:
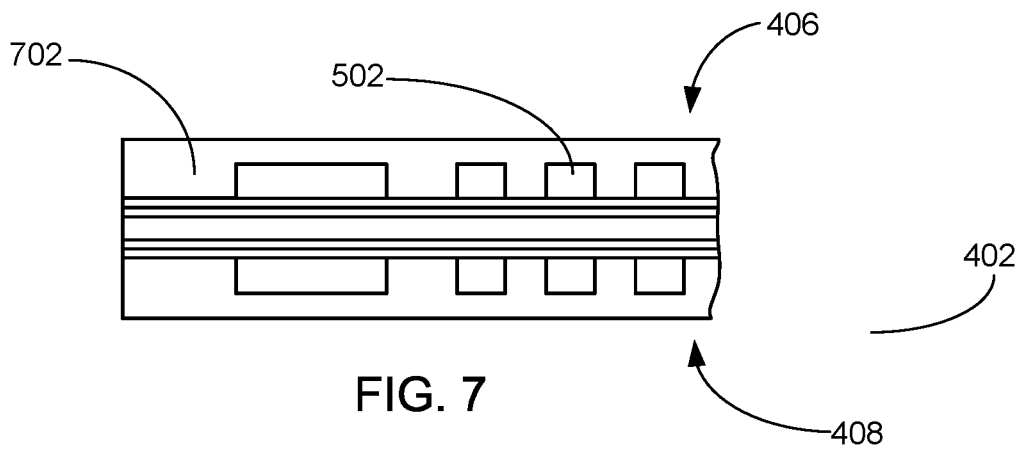
FIG. 7 is the structure of FIG. 6 in a dielectric-lamination phase of manufacture.

Referring now to FIG. 7, therein is shown the structure of FIG. 6 in a dielectric-lamination phase of manufacture. A dielectric material 702 such as polytetrafluroethylene pre-impregnated (PPG), polymers, reinforcement fibers, glass fabrics, fillers, or other fabrics can be used to form the dielectric core 114 of FIG. 1. The dielectric material 702 can be applied to and developed on the carrier top side 406 and the carrier bottom side 408 of the detach core 402. The dielectric material 702 can cover and surround the plating 502.

Figure 8:
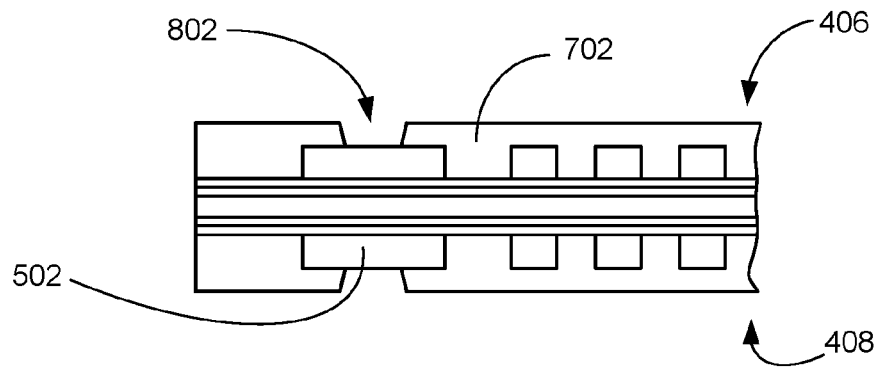
FIG. 8 is the structure of FIG. 7 in a laminate-drilling phase of manufacture.

Referring now to FIG. 8, therein is shown the structure of FIG. 7 in a laminate-drilling phase of manufacture. A drilling process is used on the dielectric material 702 to expose a portion of the plating 502 from the dielectric material 702. The drilling process can include mechanical drilling, sawing, laser drilling, and laser ablation as examples. The drilling process forms a cavity 802 in the dielectric material 702. The dielectric material 702 is drilled at the carrier top side 406 and the carrier bottom side 408.

Figure 9:
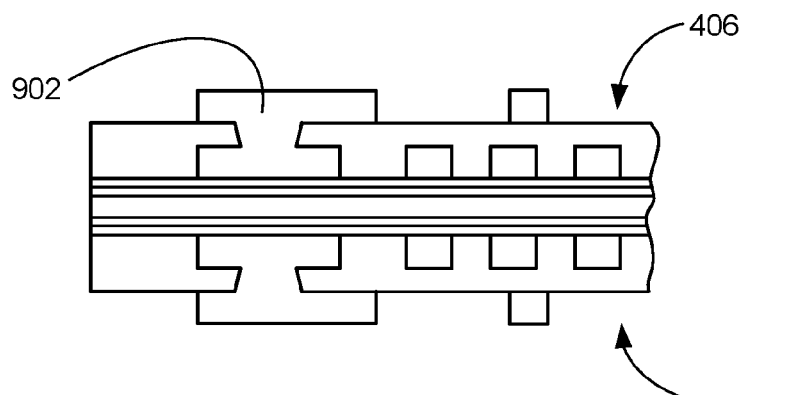
FIG. 9 is the structure of FIG. 8 in a conductive-patterning phase of manufacture.

Referring now to FIG. 9, therein is shown the structure of FIG. 8 in a conductive-patterning phase of manufacture. A conductive patterning 902 is processed on the carrier top side 406 and the carrier bottom side 408 for forming the conductive traces and vias of the dielectric core 114 of FIG. 1.

The conductive patterning 902 can be the same material used for the plating 502 of FIG. 5. The process for the conductive patterning 902 can include chemical vapor deposition (CVD), physical vapor deposition (PVD), electrolytic plating, and electroless plating processes as examples. The conductive patterning 902 can also include an etching process at the carrier top side 406 and the carrier bottom side 408.

Figure 10:
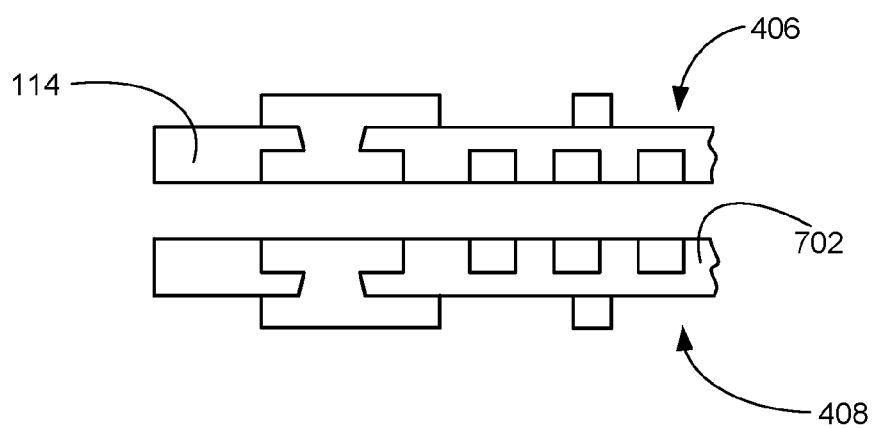
FIG. 10 is the structure of FIG. 9 in a core-separation phase of manufacture.

Referring now to FIG. 10, therein is shown the structure of FIG. 9 in a core-separation phase of manufacture. The detach core 402 of FIG. 4 is removed and the dielectric material 702 on the carrier top side 406 and the carrier bottom side 408 can both be used to form two copies of the base substrate 102 of FIG. 1. It has been discovered that the use of the detach core 402 can improving manufacturing yield by creating two identical pieces of the dielectric core 114 in a single manufacturing process.

Figure 11:
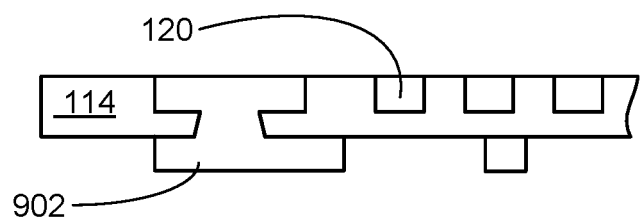
FIG. 11 is the structure of FIG. 10 in a pattern-etching phase of manufacture.

Referring now to FIG. 11, therein is shown the structure of FIG. 10 in a pattern-etching phase of manufacture. The seed layers created by the conductive-patterning phase of manufacture can be etched away for creating the embedded pad 120 and the surface trace 124 of FIG. 1. The conductive patterning 902 is embedded in the dielectric core 114, which prevents pattern loss to the exposed top surfaces of the pattern during etching.

Figure 12:
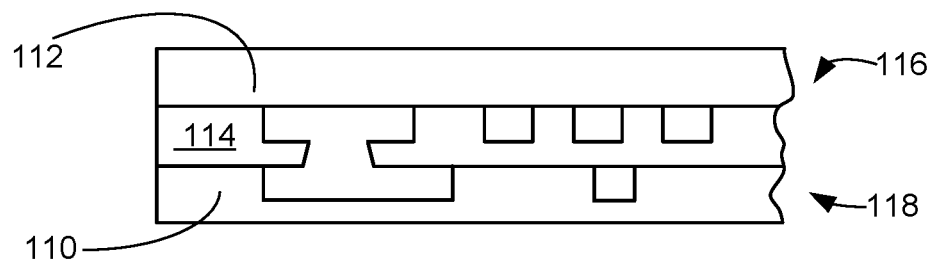
FIG. 12 is the structure of FIG. 11 in a resist-printing phase of manufacture.

Referring now to FIG. 12, therein is shown the structure of FIG. 11 in a resist-printing phase of manufacture. Solder resist material is printed on the core top side 116 and the core bottom side 118 for forming the top solder resist layer 112 and the bottom solder resist layer 110. The top solder resist layer 112 and the bottom solder resist layer 110 can completely cover the embedded conductive material that is exposed from the dielectric core 114.

Figure 13:
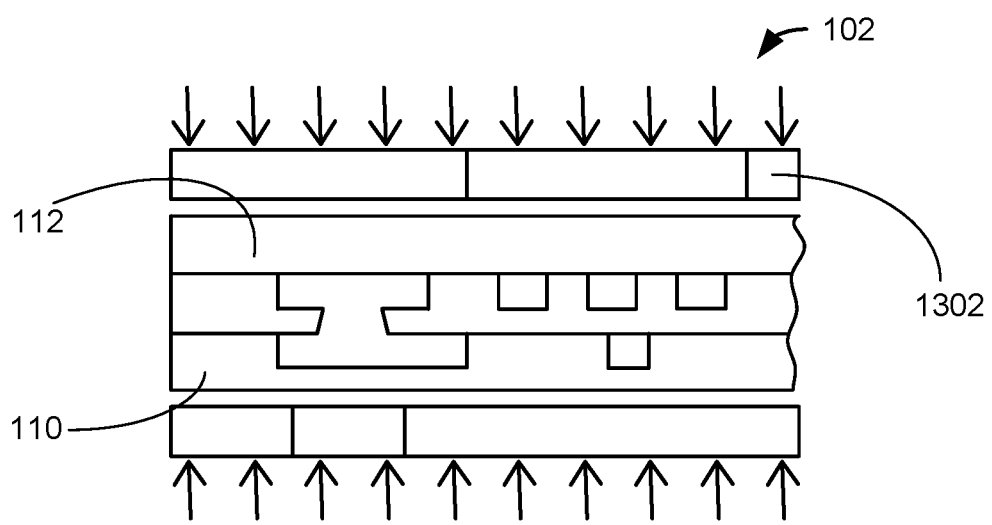
FIG. 13 is the structure of FIG. 12 in a resist-exposure phase of manufacture.

Referring now to FIG. 13, therein is shown the structure of FIG. 12 in a resist-exposure phase of manufacture. A mask 1302 can be applied to the top solder resist layer 112 and the bottom solder resist layer 110.

The base substrate 102 can be exposed to light to develop openings in the top solder resist layer 112 and the bottom solder resist layer 110 based on the openings in the mask 1302. For example, an ultra-violet etching method can be used on the top solder resist layer 112 and the bottom solder resist layer 110 for forming openings in the layers and exposing the dielectric core 114.

Figure 14:
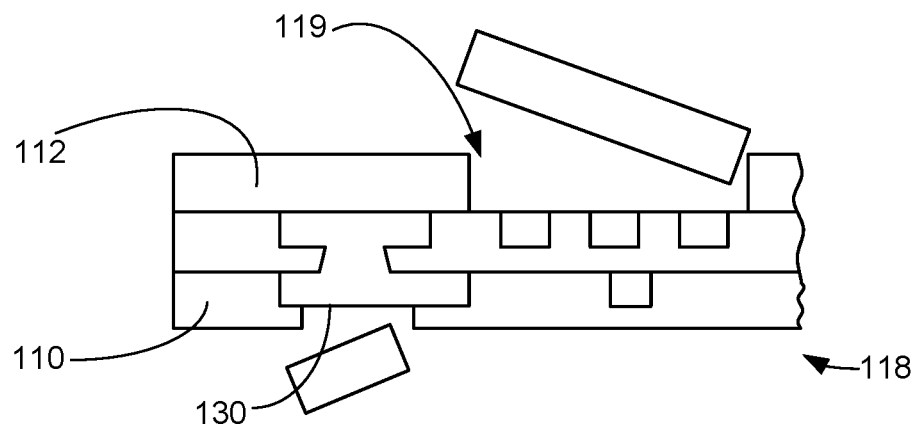
FIG. 14 is the structure of FIG. 13 in a resist-curing phase of manufacture.

Referring now to FIG. 14, therein is shown the structure of FIG. 13 in a resist-curing phase of manufacture. After the resist-exposure phase, excess material from the top solder resist layer 112 and the bottom solder resist layer 110 are removed. The surfaces of the top solder resist layer 112 and the bottom solder resist layer 110 are cured in this phase.

The development of the solder resist layer forms the mounting region 119 on the top solder resist layer 112. The development of the solder resist layer at the core bottom side 118 exposes the system pad 130 from the bottom solder resist layer 110.

Figure 15:
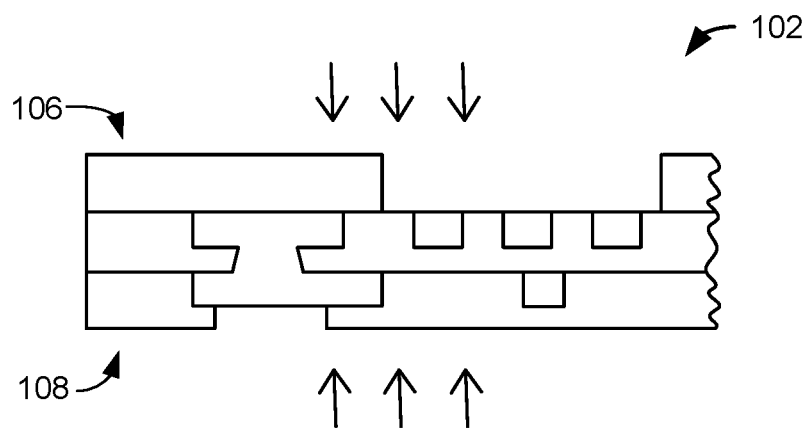
FIG. 15 is shown the structure of FIG. 14 in a preservative-coating phase of manufacture.

Referring now to FIG. 15, therein is shown the structure of FIG. 14 in a preservative-coating phase of manufacture. An organic solderability preservative (OSP) coating is applied to the component side 106 and the system side 108 of the base substrate 102.

Figure 16:
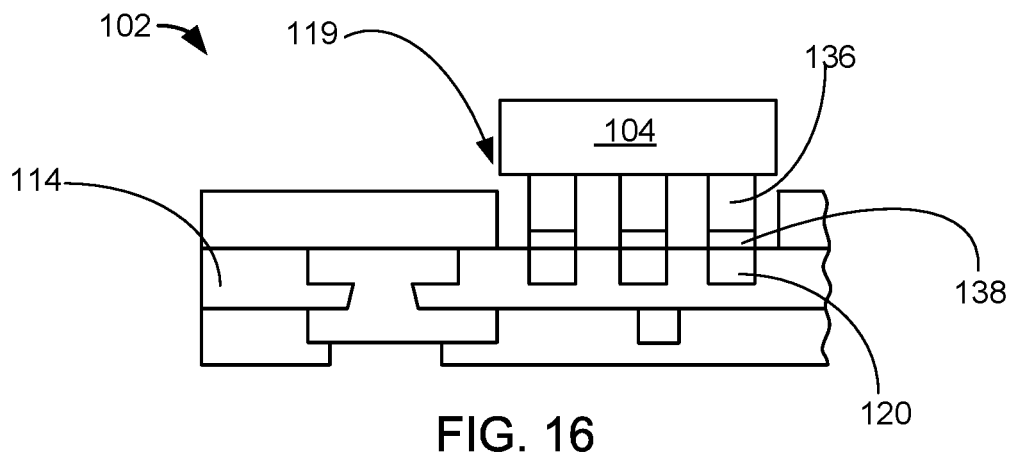
FIG. 16 is the structure of FIG. 15 in a chip-attachment phase of manufacture.

Referring now to FIG. 16, therein is shown the structure of FIG. 15 in a chip-attachment phase of manufacture. The integrated circuit device 104 can be attached to the dielectric core 114 at the mounting region 119. The device interconnect 138 can attach the interconnect pillar 136 of the integrated circuit device 104 to the embedded pad 120 of the base substrate 102.

Figure 17:
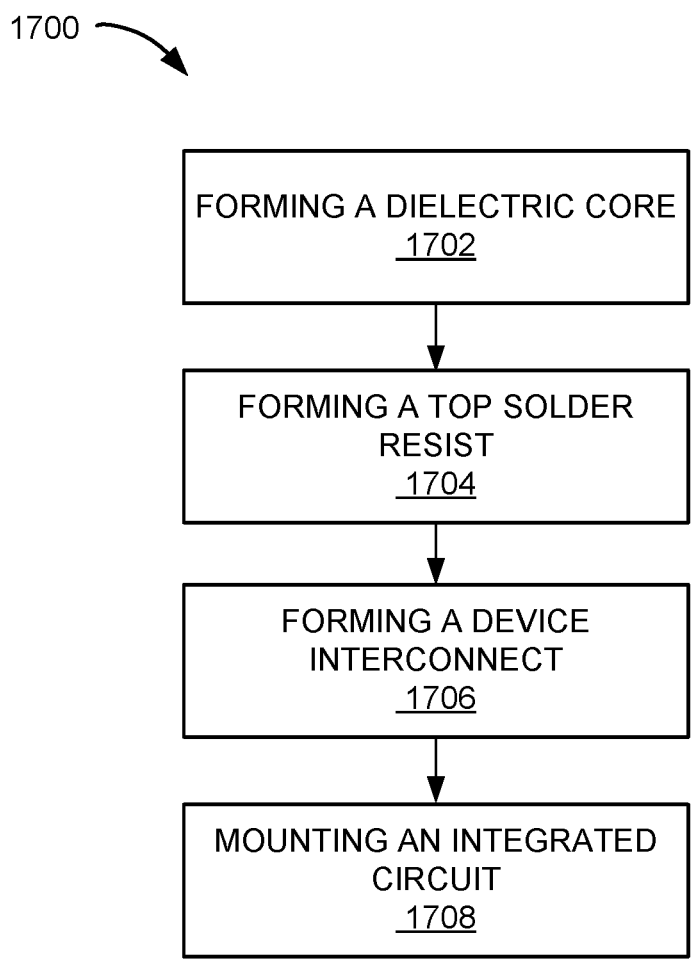
FIG. 17 is a flow chart of a method of manufacture of the integrated circuit packaging system in a further embodiment of the present invention.

Referring now to FIG. 17, therein is shown a flow chart of a method 1700 of manufacture of the integrated circuit packaging system 100 in a further embodiment of the present invention. The method 1700 includes: forming a dielectric core having an embedded pad in a block 1702; forming a top solder resist layer on the dielectric core, a pad top surface of the embedded pad below the top solder resist layer in a block 1704; forming a device interconnect on the embedded pad in a block 1706; and mounting an integrated circuit device having an interconnect pillar, the interconnect pillar attached to the device interconnect for mounting the integrated circuit device to the dielectric core in a block 1708.

Yet other important aspects of the embodiments include that it valuably supports and services the historical trend of reducing costs, simplifying systems, and increasing performance. These and other valuable aspects of the embodiments consequently further the state of the technology to at least the next level.

Thus, it has been discovered that the integrated circuit packaging system of the embodiments of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit packaging system.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    forming a dielectric core having an embedded pad and a surface trace with a width of the surface trace less than a width of the embedded pad;
    forming a top solder resist layer on the dielectric core, a pad top surface of the embedded pad below the top solder resist layer, a mounting region of the dielectric core exposed from the top solder resist layer, and a top trace surface of the surface trace coplanar with a core top side of the dielectric core and the pad top surface within the mounting region;
    forming a device interconnect on the embedded pad; and
    mounting an integrated circuit device having an interconnect pillar, the interconnect pillar attached to the device interconnect for mounting the integrated circuit device to the dielectric core.

2. The method as claimed in claim 1 wherein forming the dielectric core includes forming the embedded pad having a width of 35 μm and the surface trace having a width of 15 μm.

3. The method as claimed in claim 1 wherein forming the dielectric core includes forming the surface trace below the top solder resist layer.

4. The method as claimed in claim 1 wherein forming the dielectric core includes forming the surface trace below the core top side of the dielectric core.

5. The method as claimed in claim 1 wherein forming the dielectric core includes forming a system pad on a core bottom side of the dielectric core.

6. The method as claimed in claim 1 wherein forming the dielectric core includes forming the dielectric core having the surface trace between the embedded pad and another embedded pad, the surface trace and the embedded pad exposed from the dielectric core within the mounting region.

7. The method as claimed in claim 6 wherein forming the dielectric core includes forming the embedded pad below the core top side of the dielectric core.

8. The method as claimed in claim 6 wherein forming the dielectric core includes forming the embedded pad coplanar with the surface trace.

9. The method as claimed in claim 6 wherein forming the dielectric core includes forming the surface trace at the core top side of the dielectric core.

10. The method as claimed in claim 6 further comprising mounting an external interconnect on the core bottom side of the dielectric core.

11. An integrated circuit packaging system comprising:
    a dielectric core having an embedded pad and a surface trace, a width of the surface trace less than a width of the embedded pad;
    a top solder resist layer on the dielectric core, a pad top surface of the embedded pad below the top solder resist layer, a mounting region of the dielectric core exposed from the top solder resist layer, and a top trace surface of the surface trace coplanar with a core top side of the dielectric core and the pad top surface within the mounting region;
    a device interconnect on the embedded pad; and
    an integrated circuit device having an interconnect pillar, the interconnect pillar attached to the device interconnect for mounting the integrated circuit device to the dielectric core.

12. The system as claimed in claim 11 wherein the dielectric core includes the embedded pad having a width of 35 μm and the surface trace having a width of 15 μm.

13. The system as claimed in claim 11 wherein the dielectric core includes the surface trace below the top solder resist layer.

14. The system as claimed in claim 11 wherein the dielectric core includes the surface trace below the core top side of the dielectric core.

15. The system as claimed in claim 11 wherein the dielectric core includes a system pad on a core bottom side of the dielectric core.

16. The system as claimed in claim 11 wherein the dielectric core includes the surface trace between the embedded pad and another embedded pad in the mounting region, the surface trace between the embedded pad and the another embedded pad, the surface trace and the embedded pad exposed from the dielectric core within the mounting region.

17. The system as claimed in claim 16 the dielectric core includes the embedded pad below the core top side of the dielectric core.

18. The system as claimed in claim 16 wherein the dielectric core includes the embedded pad coplanar with the surface trace.

19. The system as claimed in claim 16 wherein the dielectric core includes the surface trace at the core top side of the dielectric core.

20. The system as claimed in claim 16 further comprising an external interconnect on the core bottom side of the dielectric core.

\* \* \* \* \*